United States Patent [19]
Eckert et al.

[11] Patent Number: 6,066,270
[45] Date of Patent: May 23, 2000

[54] PROCESS FOR THE PRODUCTION OF LOW TC SUPERCONDUCTOR MOLDED BODIES

[75] Inventors: Juergen Eckert, Dresden; Kathrin Jost, Schwedt; Oliver De Haas, Dresden; Michael Seidel, Dresden; Ludwig Schultz, Dresden, all of Germany

[73] Assignee: Institut fuer Festkoerper- und Werkstofforschung Dresden e.V., Dresden, Germany

[21] Appl. No.: 09/234,040

[22] Filed: Jan. 19, 1999

Related U.S. Application Data

[63] Continuation-in-part of application No. 08/952,795, filed as application No. PCT/EP97/01233, Mar. 11, 1997.

[30] Foreign Application Priority Data

Mar. 14, 1996 [DE] Germany .......................... 196 09 983

[51] Int. Cl.$^7$ .................................................. H01B 1/02
[52] U.S. Cl. ................................... 252/521.1; 252/521.4; 252/521.5; 505/951 B; 505/805; 420/901
[58] Field of Search ............................. 252/521.1, 521.4, 252/521.5; 505/951 B, 805, 810, 815; 148/96; 420/901

[56] References Cited

U.S. PATENT DOCUMENTS 5,470,530  11/1995  Cava et al. ............................... 420/416

FOREIGN PATENT DOCUMENTS 650204  4/1995  European Pat. Off. .

OTHER PUBLICATIONS

Lee et al. "Electronic structure of nu–based superconducting quaternary compounds YNi$_2$B$_2$X (X=B,C,N,and O)" Physical Review B, vol. 50, No. 6 pp. 4030–4033, Aug. 1994.

R. J. Cava, et al, Superconductivity in lanthanum nickel boro–nitride, Letters to Nature, vol. 372, Nov. 17, 1994.

Q. W. Yan, Superconductivity in the quaternary compounds LNi$_4$B$^4$C with L=Y, Ho, Er, and Tm Physical Review B, vol. 51, No. 13, Apr. 1, 1995.

R. Nagarajan, et al, Bulk Superconductivity at an Elevated Temperature (T$_c$≈12K) in a Nickel Containing Alloy System Y–NI–B–C. Physical Review Letters, vol. 72, No. 2, Jan. 10, 1994.

C. Godart, et al; Some Chemical and Physical Properties of Quaternary Borocarbides J. of Solid State Chemistry 133, 169–177 (1997).

M. Buchgeister, et al; Preparation an phase analysis of YNi$_2$B$_2$C, Materials Letters 22 (1995), p. 203–207.

T. E. Grigereit, et al; Observation of Oscillatory magnetic Order in the Antiferromagnetic Superconductor HoNi$_2$B$_2$C Physical Review Letters, vol. 73, No. 20, Nov. 14, 1994.

Y.Y. Sun, et al; The 23 K superconducting phase YPd$_2$B$_2$C; Physica C 230 (1994) 435–442.

Strom, et al; Superconducting Rapid Quenched YNi$_2$B$_2$C Ribbon; Physica C 235–240 (1994), 2537–2538.

L. Schultz, et al; Mechanically Alloyed Glassy Metals Topics in Applied Physics, vol.72, (1994).

H. Koshiba, et al, Nanocystallization and Magnetic Properties of Fe$_{56}$Co$_7$Ni$_7$Zr$_2$M$_8$B$_{20}$(M=Nb or Ta) Glassy Alloys Nanostructured Materials, vol. 8, No. 8, pp. 997–1005, 1997.

Shunichi Arisawa, et al; Synthesis of YNi$_2$B$_2$C Thin Films by Magnetron Sputtering Appl. Phys. Lett. 65, Sep. 5, 1994.

H. W. Zandbergen, et al; Structure of the 13–K superconductor La$_3$Ni$_2$N$_3$ and the related phase LaNiBN; Nature, vol. 372, Dec. 29, 1994.

Michor; Superconducting properties of La$_3$Ni$_2$B$_2$N$_3$–δ Physical Review B, vol. 54, No. 13, Oct. 1, 1996.

Primary Examiner—Mark Kopec
Attorney, Agent, or Firm—McAulay Nissen Goldberg Kiel & Hand, LLP

[57] ABSTRACT

The production of compact molded bodies of rare-earth transition-metal boron carbide and boron nitride compounds configured so as to avoid a selective evaporation of individual components in the production process and enable an exact adjustment of the desired stoichiometry. The process is characterized in that a) a powder mixture with particles sizes from 1 to 250 $\mu$m is produced, containing
   aa) at least one element from the group comprising Y, La, Ho, Dy, Er, Tm, Lu, Sc,
   ab) at least one element from the group comprising Ni, Cu, Co, Fe, Pd, Pt,
   ac) B and C or borides and carbides or nitrides and carbides or B and carbides or nitrides and carbon or mixtures of boron and carbon-containing solid solutions or mixtures of boron- and N-containing solid solutions;

b) converting the powder mixture by mechanical alloying or intensive grinding under an atmosphere containing argon, nitrogen or carbon, into a secondary powder with an amorphous, glass-like structure, a completely nanocrystalline structure, or a mixture of an amorphous and nanocrystalline structure;

c) heat-treating the secondary powder to form superconducting phases at formation temperatures below 1600° C.; and d) compacting the secondary powder by pressure to form superconductor molded bodies at temperatures below the crystallization temperature of the amorphous phase or below the temperature where the superconducting phase transforms into a non-superconducting phase.

10 Claims, No Drawings

PROCESS FOR THE PRODUCTION OF LOW TC SUPERCONDUCTOR MOLDED BODIES

CROSS-REFERENCE TO RELATED APPLICATIONS

The present application is a continuation-in-part of application Ser. No. 08/952,795, filed Nov. 13, 1997, now abandoned which, in turn, is a §371 application of PCT/EP97/01233, filed Mar. 11, 1997.

BACKGROUND OF THE INVENTION a) Field of the Invention

The invention is directed to a process for the production of superconductor molded bodies from rare-earth transition-metal boron carbide and boron nitride compounds.

b) Description of the Prior Art

Rare-earth transition-metal boron carbide and boron nitride compounds with superconducting characteristics by which transition temperatures of up to 23 K are achieved are already known. In this respect, representatives of the SE—Ni—B—C system (SE=Y, Tm, Er, Ho, Lu, Dy) have been thoroughly investigated heretofore, where SE $Ni_2B_2C$ was identified as a superconducting phase (R. J. Cava, et al., Nature 367, 252 (1994)).

Other superconducting phases with transition temperatures of 6 to 15 K were found for the compounds SE $Ni_4B_4C$ (SE =Y, Tm, Er, Ho), for $YNi_4BC_{0.2}$, for $YNi_2B_3C_{0.2}$ and for $La_3Ni_2BN_3$ (Q. W. Yan, et al., Phys. Rev. B 51, 8395 (1995); R. Nagarajan, et al., Phys. Lett. 72, 274 (1994); R. J. Cava, et al., Nature 372, 245 (1994); C. Godart, et al., J. Solid State Chemistry 133,169 (1997)). Even without further material optimization, the transition temperatures are accordingly in the range of the classic A15 superconductor.

It is known to use melt-metallurgical methods for the production of rare-earth transition-metal boron carbide and boron nitride compounds for superconductors. In so doing, the high melting temperatures of the intermetallic boron carbide and boron nitride superconductors require preparation by means of light-arc or levitation smelting techniques. Heretofore, primarily polycrystalline specimens were produced in this way (for example: M. Buchgeister, et al., Mat. Lett. 22, 203 (1995); R. J. Cava, et al., Nature 372, 245 (1994); C. Godart, et al., J. Solid State Chemistry 133, 169 (1997)). Further, corresponding monocrystals of intermetallic boron carbide superconductors were also prepared (for example: T. Grigereit, et al., Phys. Rev. Lett. 73, 2756 (1995)).

As a result of selective evaporation of individual components, melt-metallurgical production leads to problems with respect to the required precise adjustment of the stoichiometry and in the production of phase-pure materials (M. Buchgeister, et al., Mat. Lett. 22, 203 (1995)). On the other hand, the phase formation is determined by the thermodynamics within the framework of the equilibrium phase diagrams. Thus, for example, in the Y—Pd—B—C system with melt-metallurgical production, while a high transition temperature of 23 K is achieved, it has so far not been possible to isolate the corresponding superconductor phase in a pure phase (Y. Y. Sun, et al., Physica C 230, 435 (1994)).

It is also known to produce strip-shaped boron carbide superconductors with the nominal composition $YNi_2B_2C$ by means of the process of rapid solidification, wherein a partial amorphizing occurs during solidification (V. Ström, et al., Physica C 235–240, 2537 (1994)). Amorphizing means that the amorphous phase has a glasslike, non-crystalline structure without translational crystallographic symmetry as it is well-established for a variety of metallic alloys also including metallic alloys with elements such as Y, SE elements, transition metals as well as carbon or nitrogen (for example: L. Schultz, J. Eckert, in "Glassy Metals III", Eds. H. Beck, H.-J. Güintherodt, Springer Verlag, Berlin (1994), p. 69; H. Koshiba, et al., Nanostructured Mater. 8, 997 (1997). In this case, the achieved $YNi_2B_2C$ crystallites are presumably present in a boron-enriched amorphous matrix. Compact molded bodies cannot be produced by the technique of rapid solidification.

Finally, it is known to generate boron carbide superconductors by means of sputtering thin films (S. Arisawa, et al., Appl. Phys. Lett., 65, 1299 (1994)). In this case, amorphous Y—Pd—B—C films with a thickness of 300 nm were generated by deposition on Mg—O substrates at room temperature. The amorphous phase taking place during the deposition, is changed into the superconducting $YNi_2B_2C$ phase by subsequent annealing at 1050° C. The crystallization temperature is accordingly disadvantageously in the range of those temperatures typically used in melt-metallurgical production. Specimens that are annealed below this temperature, e.g., at 900° C., do not exhibit superconducting properties. The production of compact molded bodies is also impossible with this technique.

OBJECT AND SUMMARY OF THE INVENTION

It is the primary object of the invention to configure the production of compact molded bodies of rare-earth transition-metal boron carbide and boron nitride compounds so as to avoid a selective evaporation of individual components in the production process and enable an exact adjustment of the desired stoichiometry.

This object is met by a process wherein a) a powder mixture with particles sizes from 1 to 250 $\mu$m is produced, containing
   aa) at least one element from the group comprising Y, La, Ho, Dy, Er, Tm, Lu, Sc,
   ab) at least one element from the group comprising Ni, Cu, Co, Fe, Pd, Pt,
   ac) B and C or borides and carbides or nitrides and carbides or B and carbides or nitrides and carbon or mixtures of boron and carbon-containing solid solutions or mixtures of boron- and N-containing solid solutions;

b) this powder mixture is converted by means of high mechanical forces, especially by mechanical alloying or intensive grinding, into a secondary powder. The conversion by means of high mechanical forces is usually carried out under protective argon atmosphere. Alternatively, it can also be carried out in air under nitrogen or under carbon-containing atmosphere or under nitrogen-containing atmosphere. The resulting secondary powder has an amorphous, glass-like structure or a completely nanocrystalline structure or consists of a mixture of amorphous and nanocrystalline phases. Nanocrystalline structure means that the powder particles of the secondary powder which exhibit a crystallographic symmetry consist of individual crystallites of <1 $\mu$m, preferably of less than 100 nm;

c) the secondary powder is heat-treated, in a manner known per se, to form superconducting phases, wherein, however, formation temperatures are used which lie below the formation temperatures applied according to melt-metallurgical and rapid-solidification techniques which typically are in the range of >1000°

C.–1600° C. in detail, depending heavily on the respective alloy (for example: R. J. Cava, et al., Nature 372, 245 (1994)). The heat-treatment is preferably carried out under vacuum or under argon atmosphere or under helium atmosphere or under nitrogen atmosphere at temperatures below 1000° C.; and d) the secondary powder is compacted by pressure to form superconductor molded bodies, wherein temperatures are applied which lie below the crystallization temperature of the amorphous phase or below the temperature where the superconducting nanocrystalline phase transforms into a non-superconducting phase or phase mixture.

According to an advantageous further development of the invention, a powder mixture is produced which contains the components Y:Ni:B:C or Y:Pd:B:C in an atomic ratio of 1:2:2:1 or which contains the components La:Ni:B:N in atomic ratio of 3:2:2:3. The powder mixture can be produced from element powder or from prealloys of at least two of the components or from a mixture of prealloys and element powder or from a mixture of the aforementioned mixture of the components and nitrogen gas or from a mixture of prealloys and nitrogen gas or from a mixture of prealloys, element powder and nitrogen gas.

The mechanical alloying or intensive grinding is advisably performed by means of a planet ball mill, a swing mill, a vibrating mill or an attritor.

In the presence of a predominantly amorphous secondary powder, the pressing is carried out at temperatures which lie at least 20 k below the crystallization temperature of the amorphous phase of the material.

In the presence of a predominantly nanocrystalline secondary powder with amorphous phase components of less than 50%, the pressing is carried out at temperatures lying just below the crystallization temperature of the amorphous phase.

In the case of a completely nanocrystalline secondary powder, the pressing is carried out at temperatures below the transformation temperature of the present superconducting phase of the material. At the phases present in connection with the invention, these are preferably pressing temperatures below 900° C.

The compacting into superconducting molded bodies is advisably carried out by means of hot pressing, continuous extrusion, extrusion, hot isostatic pressing or sintering HIP technique.

In accordance with an advantageous configuration of the invention, the heat treatment for forming superconducting phases and the pressing for producing superconductor molded bodies are carried out in a combined technological step.

The process according to the invention is characterized in comparison to the prior art in that, in the production of compact molded bodies of rare-earth transition-metal boron carbide and boron nitride compounds, a selective evaporation of individual components is prevented and exact adjustment of the desired stoichiometry is made possible. The formation of the compounds is advantageously carried out below those temperatures which were previously used in conventional methods. As a result of the production of an amorphous phase or an amorphous-nanocrystalline phase mixture, superconductor molded bodies with a high density greater than or equal to 80% can be produced by transformation at temperatures lying below the crystallization temperature.

DESCRIPTION OF THE PREFERRED EMBODIMENT

The invention is explained more fully in the following with reference to embodiment examples, wherein the method of Example 1 is considered particularly advantageous.

EXAMPLE 1

Commercially available Y-, Ni-, B- and C-powders with average particle sizes of 44 to 500 $\mu$m are mixed in an atomic ratio of Y:Ni:B:C of 1:2:2:1 in a protective argon gas atmosphere and are ground in a vibrating mill. The grinding process is effected with roller bearing balls having a diameter of 10 mm. The mass ratio of balls to powder is 15:1. The grinding vessel has a volume of 250 ml and the grinding speed is 160 min$^{-1}$. The grinding process is carried out for a period of 200 hours, wherein a crystalline YNi$_2$B$_2$C phase is already present in the ground product, in addition to an amorphous phase, after 64 hours. At the end of the grinding process, there results a secondary powder which is predominantly amorphous and contains nanocrystalline YNi$_2$B$_2$C phase components.

The obtained amorphous/nanocrystalline secondary powder is then heattreated in an argon atmosphere at a temperature of 530–555° C. for complete formation of the superconducting YNi$_2$B$_2$C phase. At the same time, the powder is compacted at a pressure of 6–10 bar to form molded bodies by means of hot pressing. The molded bodies obtained in this way have a density of 80%. At a higher pressing pressure, virtually completely dense bodies can also be achieved.

EXAMPLE 2

Commercially available Y-, Ni-, B- and C-powders with average particle sizes of 44 to 500 $\mu$m are mixed in an atomic ratio of Y:Ni:B:C of 1:2:2:1 in a protective argon gas atmosphere and are ground in a vibrating mill. The grinding process is carried out with the use of roller bearing balls, some of which have a diameter of 10 mm and some of which have a diameter of 5 mm. The mass ratio of balls to powder is 10:1. The grinding vessel has a volume of 100 ml and the grinding frequency is 12.3 Hz. The grinding process is carried out for a period of 300 hours, wherein a crystalline YNi$_2$B$_2$C. phase is already present in the ground product, in addition to an amorphous phase, after 8 hours. At the end of the grinding process, there results a secondary powder which is predominantly amorphous and contains nanocrystalline YNi$_2$B$_2$C phase components.

The amorphous/nanocrystalline secondary powder obtained after grinding for 300 hours is then heat-treated in an argon atmosphere at a temperature of 530–555° C. for complete formation of the superconducting phase. At the same time, the powder is compacted at a pressure of 6–10 bar to form molded bodies by means of hot pressing. The molded bodies obtained in this way have a density of 80%.

EXAMPLE 3

Commercially available Y-, Pd-, B- and C-powders with average particle sizes of 44 to 500 $\mu$m are mixed in an atomic ratio of Y:Pd:B:C of 1:2:2:1 in a protective argon gas atmosphere and are ground in a vibrating mill. The grinding process is effected with the use of roller bearing balls, some of which have a diameter of 10 mm and some of which have a diameter of 5 mm. The mass ratio of balls to powder is 10:1. The grinding vessel has a volume of 100 ml and the grinding frequency is 12.3 Hz. The grinding process is carried out for a period of 300 hours, wherein a crystalline YPd$_2$B$_2$C phase is already present in the ground product after 16 hours. At the end of the grinding process, there results a secondary powder which is nanocrystalline and which predominantly comprises the superconducting YPd$_2$B$_2$C phase.

The obtained nanocrystalline secondary powder is then heat-treated in an argon atmosphere at a temperature below 900° C. At the same time, the powder is compacted at a pressure of 6–10 bar to form molded bodies by means of hot pressing. The molded bodies obtained in this way have a density of 80%.

EXAMPLE 4

Commercially available LaN; Ni- and B-powders with average particle sizes of 44 to 500 μm are mixed in an atomic ratio of La:Ni:B:N of 3:2:2:3 in a nitrogen gas atmosphere and are ground in a vibrating mill. The grinding process is effected with roller bearing balls having a diameter of 10 mm. The mass ratio of balls to powder is 45:1. The grinding vessel has a volume of 250 ml and the grinding speed is 150 min$^{-1}$. The grinding process is carried out for a period of 50 hours, wherein a crystalline $La_3Ni_2B_2N_3$ phase is already present, in addition to an amorphous phase, after 10 hours. At the end of the grinding process, a secondary powder results which is predominantly amorphous and contains nanocrystalline $La_3Ni_2B_2N_3$ phase components.

The amorphous/nanocrystalline secondary powder is then heat-treated in a nitrogen atmosphere at a temperature of 620–700° C. for complete formation of the superconducting $La_3Ni_2B_2N_3$ phase. At the same time, the powder is compacted at a pressure of 6–10 bar to form molded bodies by means of hot pressing. The molded bodies obtained in this way have a density of 80%. At a higher pressure, virtually dense bodies can also be achieved.

While the foregoing description represents the present invention, it will be obvious to those skilled in the art that various changes may be made therein without departing from the true spirit and scope of the present invention.

What is claimed is:

1. A process for the production of superconductor molded bodies from rare-earth transition-metal boron carbide and boron nitride compounds comprising the steps of
   a) producing a powder mixture of particles having sizes from 1 to 250 μm, the mixture comprising
      aa) at least one element selected from the group consisting of Y, La, Ho, Dy, Er, Tm, Lu, and Sc,
      ab) at least one element selected from the group consisting of Ni, Cu, Co, Fe, Pd, and Pt,
      ac) a pair selected from the group of pairs consisting of B and C, borides and carbides, nitrides and carbides, B and carbides, nitrides and carbon, mixtures of boron and carbon-containing solid solutions, and mixtures of boron- and N-containing solid solutions;
   b) converting the powder mixture by mechanical alloying or intensive grinding under an atmosphere containing argon, nitrogen or carbon, into a secondary powder with an amorphous, glass-like structure, a completely nanocrystalline structure, or a mixture of an amorphous and nanocrystalline structure;
   c) heat-treating the secondary powder to form superconducting phases at formation temperatures below 1600° C.; and
   d) compacting the secondary powder by pressure to form superconductor molded bodies at temperatures below the crystallization temperature of the amorphous phase or below the temperature where the superconducting phase transforms into a non-superconducting phase.

2. The process according to claim 1, wherein a powder mixture is produced which contains the components Y:Ni:B:C or Y:Pd:B:C in an atomic ratio of 1:2:2:1 or which contains the components La:Ni:B:N in an atomic ratio of 3:2:2:3.

3. The process according to claim 2, wherein the powder mixture is produced from an elemental powder, prealloys of at least two elements and mixtures thereof with or without nitrogen gas.

4. The process according to claim 1, wherein step b) is carried out by a means selected from the group consisting of a planet ball mill, a swing mill, a vibrating mill and an attritor.

5. The process according to claim 1, wherein the compacting is carried out in the presence of a predominantly amorphous secondary powder at temperatures which lie at least 20 k below the crystallization temperature of the amorphous phase thereof.

6. The process according to claim 1, wherein the compacting is carried out in the presence of a predominantly nanocrystalline secondary powder with amorphous phase components of less than 50%, at temperatures lying just below the crystallization temperature of the amorphous phase thereof.

7. The process according to claim 1, wherein the secondary powder is completely nanocrystalline and the compacting is carried out at temperatures below the transformation temperature of the superconducting phase of the material.

8. The process according to claim 7, wherein the compacting is carried out at temperatures below 900° C.

9. The process according to claim 1, wherein step d) is carried out by a means selected from the group consisting of hot pressing, continuous extrusion, extrusion, hot isostatic pressing and a sintering HIP technique.

10. The process according to claim 1, wherein steps c) and d) are carried out together.

* * * * *